US012615849B2

(12) United States Patent
Manceau et al.

(10) Patent No.: US 12,615,849 B2
(45) Date of Patent: Apr. 28, 2026

(54) TANDEM PHOTOVOLTAIC DEVICE COMBINING A SILICON-BASED SUB-CELL AND A PEROVSKITE-BASED SUB-CELL COMPRISING A P- OR N-TYPE MATERIAL/PEROVSKITE COMPOSITE LAYER

(71) Applicants: COMMISSARIAT À L'ÉNERGIE ATOMIQUE ET AUX ÉNERGIES ALTERNATIVES, Paris (FR); 3SUN S.R.L., Catania (IT)

(72) Inventors: Matthieu Manceau, Grenoble (FR); Olivier Dupre, Grenoble (FR); Noella Lemaitre, Grenoble (FR)

(73) Assignees: COMMISSARIAT À L'ÉNERGIE ATOMIQUE ET AUX ÉNERGIES ALTERNATIVES, Paris (FR); 3SUN S.R.L., Catania (IT)

( * ) Notice: Subject to any disclaimer, the term of this patent is extended or adjusted under 35 U.S.C. 154(b) by 0 days.

(21) Appl. No.: 18/251,844

(22) PCT Filed: Oct. 25, 2021

(86) PCT No.: PCT/FR2021/051876
§ 371 (c)(1),
(2) Date: May 4, 2023

(87) PCT Pub. No.: WO2022/096802
PCT Pub. Date: May 12, 2022

(65) Prior Publication Data
US 2024/0008296 A1     Jan. 4, 2024

(30) Foreign Application Priority Data
Nov. 5, 2020    (FR) ...................................... 2011346

(51) Int. Cl.
H10K 30/40        (2023.01)
H10F 10/142       (2025.01)
(Continued)

(52) U.S. Cl.
CPC ......... H10F 10/142 (2025.01); H10K 30/211 (2023.02); H10K 30/40 (2023.02);
(Continued)

(58) Field of Classification Search
CPC ........ H10K 30/10; H10K 30/40; H10K 30/50; H10K 30/57
See application file for complete search history.

(56) References Cited

U.S. PATENT DOCUMENTS

2018/0174761 A1     6/2018   Kamino et al.

OTHER PUBLICATIONS

Liu N, Wang L, Xu F, Wu J, Song T and Chen Q (2020) Recent Progress in Developing Monolithic Perovskite/Si Tandem Solar Cells. Front. Chem. 8:603375. doi: 10.3389/fchem.2020.603375.*
(Continued)

*Primary Examiner* — Christina Chern
(74) *Attorney, Agent, or Firm* — Chrisman Gallo Tochtrop LLC

(57) ABSTRACT

Tandem photovoltaic device combining a silicon-based sub-cell and a perovskite-based sub-cell comprising a P- or N-type material/perovskite composite layer including: A/a silicon-based sub-cell A; and B/a perovskite-based sub-cell B, comprising at least: —a conductive or semiconductor layer of the N type in the case of a NIP structure, or of the P type in the case of a PIN structure, and—a composite layer, superimposed over the lower conductive or semiconductor layer, comprising at least one perovskite material and at least one material of the P type in the case of a NIP structure or of the N type material in the case of a PIN structure.

12 Claims, 3 Drawing Sheets

(51) Int. Cl.

| | |
|---|---|
| *H10K 30/20* | (2023.01) |
| *H10K 30/80* | (2023.01) |
| *H10K 71/12* | (2023.01) |
| *H10K 71/40* | (2023.01) |
| *H10K 85/50* | (2023.01) |
| *H10K 30/35* | (2023.01) |
| *H10K 30/57* | (2023.01) |

(52) U.S. Cl.
CPC ........... *H10K 30/865* (2023.02); *H10K 71/12* (2023.02); *H10K 71/40* (2023.02); *H10K 85/50* (2023.02); *H10K 30/35* (2023.02); *H10K 30/57* (2023.02)

(56) References Cited

OTHER PUBLICATIONS

Wu et al. (2018) Heterojunction Engineering for High Efficiency Cesium Formamidinium Double-Cation Lead Halide Perovskite Solar Cells. ChemSusChem 2018, 11, 837-842.*

Bush et al. ("Minimizing Current and Voltage Losses to Reach 25% Efficient Monolithic Two-Terminal Perovskite-Silicon Tandem Solar Cells"), ACS Energy Lett. 2018, 3, 2173-2180.*

Shao, Yuchan er al. "Origin and elimination of photocurrent hysteresis by fullerene passivation in CH3NH3PbI3 planar heterojunction solar cells" Nature Communications, vol. 5, No. 1, Dec. 1, 2014 (Dec. 1, 2014).

Kim, Chan Ul et al., "Optimization of device design for low cost and high efficiency planar monolithic perovskite/silicon tandem solar cells" Nano Energy, vol. 60. Jun. 1, 2019 (Jun. 1, 2019). pp. 213-221.

Bett, Alexander J. et al., "Two-terminal Perovskite silicon tandem solar cells with a high-Bandgap Perovskite absorber enabling voltages over 1.8 V" Progress in Photovoltaics: Research and Applications, vol. 28, No. 2, Nov. 7, 2019 (Nov. 7, 2019), pp. 99-110.

Schuize, Patricia S.C. et al., "25.1 % High-Efficiency Monolithic Perovskite Silicon Tandem Solar Cell with a High Bandgap Perovskite Absorber" SOLAR RRL, vol. 4, No. 7, May 26, 2020 (May 26, 2020), p. 2000152.

Fraunhofer, Ise. et al. "The Race for the Best Silicon Bottom Cell: Efficiency and Cost Evaluation of Perovskite-Silicon Tandem Solar Cells" Sep. 7, 2020 (Sep. 7, 2020), Retrieved from the Internet: https://www.eupvsec-proceedings.com/proceedings?pa per=49292 [retrieved on Jul. 8, 2021] XP055822427 p. 18.

International Search Report for PCT/FR2021/051876 dated Feb. 16, 2022.

Written Opinion for PCT/FR2021/051876 dated Feb. 16, 2022.

Wu et al., "Perovskite Solar Cells with 18.21% Efficiency and Area Over 1 cm2 Fabricated by Heterojunction Engineering", Nature Energy, Sep. 2016.

Wu et al., "Perovskite Solar Cells with 18.21% Efficiency and Area Over 1 cm2 Fabricated by Heterojunction Engineering", Nature Energy, Supplemental Information, Sep. 2016.

Wu et al., "Heterojunction Engineering for High Efficiency Cesium-Formamidinium Double Cation Lead Halide Perovskite Solar Cells", ChemSusChem, Dec. 15, 2017.

Wu et al., "Heterojunction Engineering for High Efficiency Cesium-Formamidinium Double Cation Lead Halide Perovskite Solar Cells", ChemSusChem, Supplemental Information, Dec. 15, 2017.

Yan et al., "A Review on c-Si Bottom Cell for Monolithic Perovskite/Silicon Tandem Solar Cells", Materials Today Nano, Jun. 30, 2019.

* cited by examiner

Abrasion time (s)

Abrasion time (s)

1

TANDEM PHOTOVOLTAIC DEVICE COMBINING A SILICON-BASED SUB-CELL AND A PEROVSKITE-BASED SUB-CELL COMPRISING A P- OR N-TYPE MATERIAL/PEROVSKITE COMPOSITE LAYER

CROSS-REFERENCE TO RELATED APPLICATIONS

This is a National Stage application of PCT international application PCT/FR2021/051876, filed on Oct. 25, 2021, which claims the priority of French Patent Application No. FR 2011346, filed Nov. 5, 2020, both of which are incorporated herein by reference in their entirety.

TECHNICAL FIELD

The present invention relates to the field of tandem-type photovoltaic devices, in particular tandem-type photovoltaic cells, combining a silicon-based sub-cell and a perovskite-based sub-cell.

More particularly, it relates to such silicon/perovskite tandem photovoltaic devices, including, at the perovskite-based sub-cell, a composite layer integrating a perovskite-type material and a conductive or semiconductor material of the P type in the case of a sub-cell with a NIP structure or of the N type in the case of a sub-cell with a PIN structure, while maintaining the desired performances in terms of photovoltaic conversion efficiency of the tandem device.

Prior Art

Photovoltaic devices, and in particular photovoltaic cells, generally comprise a multilayer stack including a photoactive layer, called the "active" layer. In so-called perovskite-type photovoltaic cells, the active layer consists of a halogenated perovskite type material, which may be an organic-inorganic hybrid or purely inorganic. This active layer is in contact on either side with an N-type conductive or semiconductor layer and a P-type conductive or semiconductor layer. This type of multilayer assembly, comprising the superposition of the active layer and of the two P-type and N-type layers described hereinabove is conventionally referred to as "NIP" or "PIN" depending on the stacking order of the different layers over the substrate.

For example, as represented in FIG. 1, a single-junction photovoltaic cell, with a NIP structure typically includes a multilayer structure comprising, in this stacking order, a transparent substrate (S), a first transparent electrode also called the lower electrode ($E_1$), such as a layer made of transparent conductive oxide (TCO), an N-type conductive or semiconductor layer, an active layer, for example of the perovskite (PK) type, a P-type conductive or semiconductor layer and a second electrode, also called the upper electrode ($E_2$) (which may be made of metal, for example silver or gold).

The active layer is a layer intended to absorb photons. It enables the creation of free charge carriers (holes and electrons).

In order to increase the efficiency of photovoltaic cells, tandem photovoltaic devices have recently been developed. These tandem devices allow widening the absorption range of the electromagnetic spectrum, by association of two cells absorbing photons of different wavelengths.

Tandem devices may consist of a perovskite-based cell and a silicon-based cell. Different structure types have been developed, such as two-terminal (2T) structures and four-terminal (4T) structures, as schematically represented in FIG. 2. In general, the 2T structures include two electrodes, each forming an anode and a cathode common to the two sub-cells, while the 4T structures include four electrodes, each sub-cell having its pair of electrodes.

For example, FIG. 3 represents a tandem device in a 2T structure including a first silicon-based sub-cell, for example with a silicon homojunction (c-Si), surmounted by a perovskite-based sub-cell in a NIP structure and connected to the silicon-based sub-cell through a recombination layer (RC).

At the present time, perovskite devices are typically made by successive depositions of layers one after another. In the case where these depositions are carried out using a solvent-based process, for example by centrifugal coating (better known as "spin-coating"), the problem arises of the choice of the solvent(s) to be implemented, to prevent the deposited layer from causing degradation of the underlying layer.

More particularly, the problem arises for the deposition of the upper conductive or semiconductor layer, of the P type in the case of a NIP-type structure, and of the N type in the case of a PIN structure, on the surface of the perovskite. Thus, the upper conductive or semiconductor layer is generally formed from a solution or a dispersion of said semiconductor material(s) in one or more apolar solvent(s), in order not to damage the perovskite, soluble in the polar solvents. Hence, the adhesion between the perovskite and the overlying conductive or semiconductor layer thus formed is particularly weak, which might pose problems in terms of stability, in particular mechanical stability, of the structure thus formed.

SUMMARY OF THE INVENTION

The present invention aims specifically to provide a new tandem photovoltaic device, whose structure allows overcoming the aforementioned problems in terms of compatibility of the formulation implemented to form the upper conductive or semiconductor layer with an underlying perovskite-type active layer.

Thus, the Inventors have demonstrated that it was possible to make tandem photovoltaic devices, comprising a silicon-based sub-cell, in particular a silicon heterojunction sub-cell or in a "TOPCon" type architecture, and a perovskite-based sub-cell, featuring excellent performances, by integrating at the perovskite-based sub-cell, at the surface of the lower semiconductor conductive layer of the N type in the case of making of a sub-cell in a NIP structure or of the P type in the case of making of a sub-cell in a PIN structure, a composite layer combining the perovskite material and the material of the upper conductive or semiconductor layer, of the P type in the case of a NIP structure or of the N type in the case of a PIN structure.

More specifically, according to a first aspect thereof, the present invention relates to a tandem photovoltaic device, comprising, in this superimposition order:

A/a silicon-based sub-cell A comprising at least:
  a substrate made of crystalline, for example monocrystalline or polycrystalline, silicon in particular N-type or P-type doped; and
  at least one layer, distinct from said substrate made of crystalline silicon, of amorphous or polycrystalline silicon, N or P doped;
  and B/a perovskite-based sub-cell B, comprising at least:
  a conductive or semiconductor layer, called the lower layer, of the N type in the case of a NIP structure (also denoted "ETL" standing for "Electron Transporting Layer"), or of the P type in the case of a PIN structure (denoted "HTL" standing for "Hole Transporting Layer"), and a composite layer, superimposed over said lower conductive or semiconductor layer, comprising at least one perovskite material and at least one material of the P type in the case of a NIP structure or of the N type in the case of a PIN structure, and having a gradient of the perovskite material/P material mass ratio in the case of a NIP structure or perovskite material/N material mass ratio in the case of a PIN structure, decreasing in the direction from the interface between said composite layer and said lower conductive or semiconductor layer towards the opposite face of said composite layer, the perovskite-based sub-cell B having a planar structure.

By "superimposed", it should be understood that said composite layer is present at the surface of said lower conductive or semiconductor layer, in other words said layers have a common interface. On the other hand, this does not mean that the composite layer extends over the entire surface of the underlying conductive or semiconductor layer.

In particular, the composite layer according to the invention does not extend over the entire surface of the underlying conductive or semiconductor layer.

Thus, the composite layer of the perovskite-based sub-cell B features an inhomogeneous distribution of the perovskite and P-type (or N-type) materials. The distribution of the perovskite and P-type (or N-type) materials is such that the perovskite material/P material mass ratio in the case of a NIP structure or perovskite material/N material mass ratio in the case of a PIN structure is higher in the vicinity of the interface of said composite layer with the underlying conductive or semiconductor layer of the sub-cell B and lower in the vicinity of the opposite face of said composite layer.

In particular, as detailed more particularly in the rest of the text, the perovskite material and the P-type (or N-type) material form, within the composite layer according to the invention, over a thickness of at least 10 nm, in particular over a thickness of 10 to 150 nm, an interpenetrating structure.

This interpenetrating structure can be identified by analysis by time-of-flight secondary ion mass spectrometry (ToF-SIMS standing for "Time-of-Flight Secondary Ion Mass Spectrometry"). More particularly, this interpenetrating structure is composed of said P-type (or N-type) material(s) incorporated into a perovskite matrix.

Said perovskite/P material (or N material) composite layer as defined hereinabove will be referred to more simply in the rest of the text as "composite layer".

The perovskite-based sub-cell B of a tandem device according to the invention differs from the structures with a so-called "mesoporous" architecture, as disclosed for example in the publication Rong et al. [1]. The so-called "mesoporous" architectures implement a mesoporous layer within which the perovskite is partially infiltrated. In general, in this type of structure, the perovskite is interpenetrated with the lower conductive or semiconductor layer, of the N type in the case of a NIP structure or of the P type in the case of a PIN structure.

Unlike these structures with a mesoporous architecture, the perovskite-based sub-cell B of a tandem device according to the invention has more particularly a so-called "planar" architecture. By "planar" architecture, it should be understood that each of the layers of the multilayer stack forming the sub-cell B is compact.

Thus, advantageously, the perovskite-based sub-cell B with a NIP or PIN structure of a tandem device according to the invention does not implement a layer based on a mesoporous material.

In particular, the interface between the composite layer according to the invention and the underlying conductive or semiconductor layer at the sub-cell B forms a planar junction. In other words, it is of the planar type.

As illustrated in the following example, a composite layer according to the invention leads to performances of a photovoltaic cell, in particular in terms of photovoltaic conversion efficiency, similar to those that could be obtained via the implementation of distinct active layer/P-type (or N-type) layer superimposed layers.

Advantageously, the preparation of a perovskite-based sub-cell according to the invention allows overcoming the compatibility problems, encountered during the formation of a conventional perovskite sub-cell with a planar architecture, between the formulation implementation for the formation of the upper conductive or semiconductor layer and the underlying perovskite crystallised active layer, and the risk of deterioration of the latter.

According to another aspect thereof, the invention relates to a method for manufacturing a tandem photovoltaic device according to the invention, comprising at least the following steps:

making a silicon-based sub-cell A, as defined before; and (b) making a perovskite-based sub-cell B as defined before, in which said composite layer is formed at the surface of said N-type or of P-type lower conductive or semiconductor layer, at least via the following steps:

forming, on the surface of said lower conductive or semiconductor layer, a wet film from a solution of precursors of the perovskite material in one or more solvent(s);

(ii) adding to said wet film of step (i) at least one material of the P type in the case of the formation of a NIP stack, and of the N type in the case of a PIN stack; and (iii) subjecting the whole to a heat treatment conducive to the elimination of the solvents and the crystallisation of the perovskite material.

Advantageously, the composite layer of the sub-cell B of a tandem device according to the invention is formed through a wet process. Preferably, step (ii) is carried out by depositing, over the surface of said wet film of step (i), a formulation of at least one material of the P type in the case of the formation of a NIP stack, also called "P-type ink" (or of the N type in the case of the formation of a PIN stack, also called "N-type ink"), in one or more solvent(s), called "anti-solvents", in which the perovskite precursors are not soluble.

According to a particular embodiment, as detailed more specifically in the rest of the text, steps (i) and (ii) may be carried out by a solvent-based process, more particularly by spin-coating or centrifugal coating, better known as "spin-coating".

Advantageously, the deposition of the P-type or N-type ink at step (ii) of the method of the invention, preferably by spin-coating, simultaneously performs the "quenching" of the perovskite.

As disclosed for example in the publication Xiao et al. [2], in the context of the preparation of a perovskite active layer, the method known as "solvent quenching" consists more particularly in depositing precursors of the perovskite active layer over the wet film, during spin-coating, an amount of anti-solvent, for example toluene and chlorobenzene, to induce rapid crystallisation of the perovskite. The addition of an anti-solvent, by rapidly reducing the solubility of the perovskite precursors in the solvent medium, advantageously allows promoting nucleation and rapid growth of the perovskite crystals. It has been demonstrated that such a "quenching" operation advantageously allows improving the crystallinity of the perovskite material, upon completion of the thermal annealing, and thus the quality of the resulting perovskite active layer.

Thus, advantageously, the invention provides a simplified method for making the perovskite-based sub-cell of a silicon/perovskite tandem photovoltaic device according to the invention, wherein the steps of "solvent quenching" of the perovskite and of forming the upper conductive or semiconductor layer are advantageously combined before proceeding with the crystallisation of the perovskite. Thus, the method of the invention allows reducing the number of steps necessary for the preparation of the perovskite-based sub-cell and therefore of the tandem device.

Finally, the implementation of a composite layer according to the invention at the perovskite-based sub-cell of a tandem photovoltaic device according to the invention proves to be particularly advantageous from the optical point of view. Indeed, unlike single junction devices for which the illumination is generally done through the substrate, in a tandem structure, the illumination is done via the upper face, as schematically represented in FIG. 3, and must therefore pass through the conductive or semiconductor interface layer (of the P type in a NIP structure as represented in FIG. 3; of the N type in a PIN structure), before reaching the perovskite active layer.

On the other hand, in a structure implementing a composite layer according to the invention, for example a perovskite/P layer (PK:P) composite layer as represented in FIGS. 4 to 6, the filter effect due to the upper interface layer is advantageously reduced. Also, the possible losses by reflections at the perovskite/interface layer interface are advantageously reduced.

As detailed in the rest of the text, the tandem photovoltaic device according to the invention may for example have a structure with two terminals (2T).

Other features, variants and advantages of the tandem photovoltaic devices according to the invention, and of preparation thereof, will appear better upon reading the following description, examples and figures, given as a non-limiting illustration of the invention.

Figure 1:
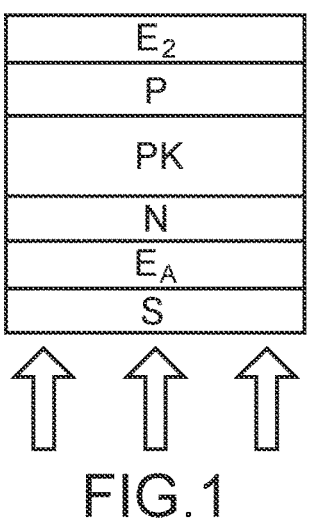
FIG. 1 schematically represents, in a vertical sectional plane, a conventional single-junction photovoltaic cell, with a NIP structure.
Figure 2:
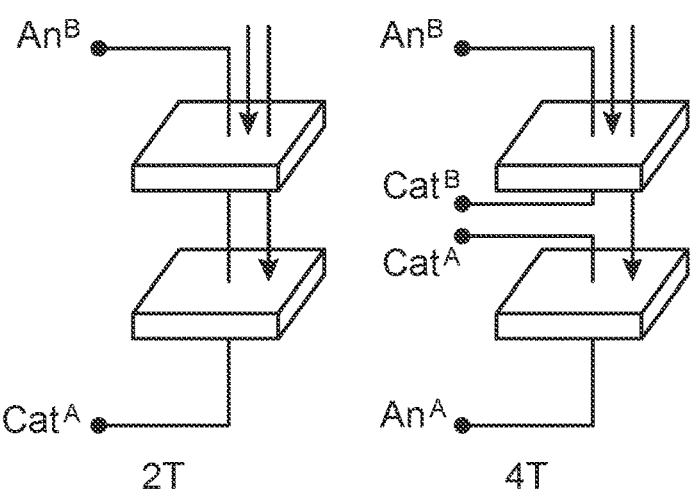
FIG. 2 schematically illustrates a tandem photovoltaic device having 2 terminals (2T) or 4 terminals (4T).
Figure 3:
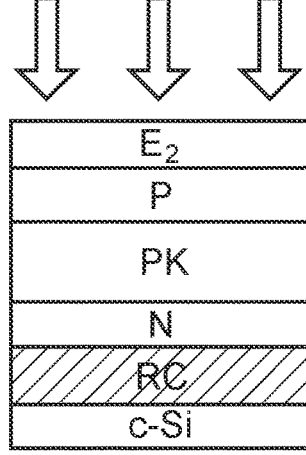
FIG. 3 schematically represents, in a vertical sectional plane, a conventional tandem photovoltaic cell, having a silicon-based sub-cell A ("c-Si") and a perovskite-based sub-cell B with a NIP architecture.

It should be noted that, for clarity, the different elements in the figures are plotted in free scale, the actual dimensions of the different portions not being complied with.

In the rest of the text, the expressions "comprised between . . . and . . . ", "ranging from . . . to . . . " and "varying from . . . to . . . " are equivalent and are intended to mean that the bounds are included unless stated otherwise.

DETAILED DESCRIPTION

As indicated before, the invention relates, according to a first aspect thereof, to a tandem photovoltaic device, in particular a tandem photovoltaic cell, comprising, in this superimposition order:

A/a silicon-based sub-cell A comprising at least:
a substrate made of crystalline, for example monocrystalline or polycrystalline, silicon in particular N-type or P-type doped; and
at least one layer, distinct from said substrate made of crystalline silicon, of amorphous or polycrystalline silicon, N or P doped;
and B/a perovskite-based sub-cell B, comprising at least:
a conductive or semiconductor layer, called the lower layer, of the N type in the case of a NIP ("ETL") structure, or of the P type in the case of a PIN ("HTL") structure, and
a composite layer, superimposed over said lower conductive or semiconductor layer, comprising at least one perovskite material and at least one material of the P type in the case of a NIP structure or of the N type in the case of a PIN structure, and having a gradient of the perovskite material/P material mass ratio in the case of a NIP structure or perovskite material/N material mass ratio in the case of a PIN structure, decreasing in the direction from the interface between said composite layer and said lower conductive or semiconductor layer towards the opposite face of said composite layer.

It also relates to a method for manufacturing a tandem photovoltaic device, in particular a tandem photovoltaic cell, comprising at least the following steps:
making a silicon-based sub-cell A, comprising at least:
a substrate made of crystalline, for example monocrystalline or polycrystalline, silicon possibly N-type or P-type doped; and
at least one layer, distinct from said substrate made of crystalline silicon, of amorphous or polycrystalline silicon, N or P doped;
(b) making a perovskite-based sub-cell B, comprising at least:

a conductive or semiconductor layer, called the lower layer, of the N type ("ETL") in the case of a NIP structure or of the P type ("HTL") in the case of a PIN structure, and a composite layer, superimposed over said lower conductive or semiconductor layer, comprising at least one perovskite material and at least one material of the P type in the case of a NIP ("PK:P") or of the N type structure in the case of a PIN structure, in which said composite layer is formed at the surface of said lower N-type or P-type conductive or semiconductor layer, at least via the following steps:

forming, on the surface of said lower conductive or semiconductor layer, a wet film from a solution of precursors of the perovskite material in one or more solvent(s);

(ii) adding to said wet film of step (i) at least one material of the P type in the case of the formation of a NIP stack, and of the N type in the case of a PIN stack; and (iii) subjecting the whole to a heat treatment conducive to the elimination of the solvents and the crystallisation of the perovskite material.

Figure 4:
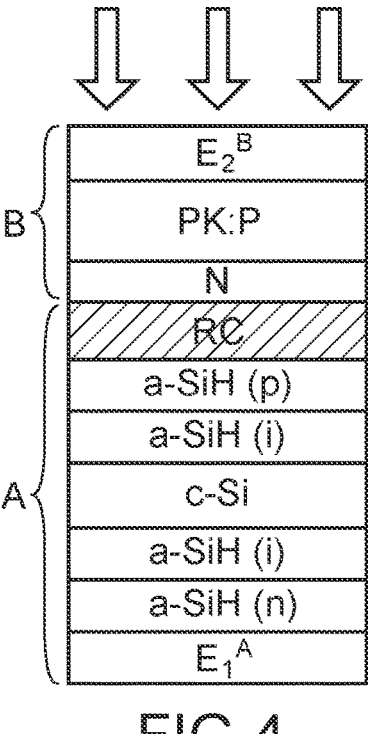
FIG. 4 schematically represents, in a vertical sectional plane, the structure of a HET/perovskite tandem cell in a 2T structure according to the invention, comprising a silicon heterojunction sub-cell A and a perovskite-based sub-cell B integrating a perovskite/P material (PK:P) composite layer according to the invention.
Figures 5, 6:
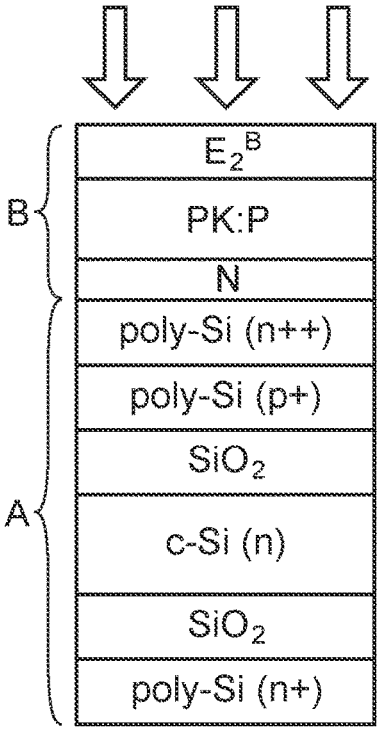
FIG. 5 schematically represents, in a vertical sectional plane, the structure of a TOPCon/perovskite tandem cell according to the invention, comprising a silicon-based sub-cell A according to a first variant with a TOPCon structure and a perovskite-based sub-cell B integrating a perovskite/P material (PK:P) composite layer according to the invention.
FIG. 6 schematically represents, in a vertical sectional plane, the structure of a TOPCon/perovskite tandem cell according to the invention, comprising a silicon-based sub-cell A according to a second variant with a TOPCon structure and a perovskite-based sub-cell B integrating a perovskite/P material (PK:P) composite layer according to the invention.

As schematically represented in FIGS. 4 to 6, the illumination of a 2T tandem device according to the invention is done through the upper electrode of the perovskite-based sub-cell B.

Unless indicated otherwise, an N-type (respectively P-type) layer according to the invention may consist of one single N-type (respectively P-type) doped layer or of a multilayer stack of at least two sub-layers, for example of three N-type (respectively P-type) doped sub-layers.

Silicon-Based Sub-Cell A:

As stated before, the perovskite-based sub-cell B is stacked over a silicon-based sub-cell A comprising at least one substrate made of crystalline, for example monocrystalline or polycrystalline, in particular monocrystalline, silicon possibly N-type or P-type doped; and at least one layer, distinct from said substrate made of crystalline silicon, of amorphous or polycrystalline silicon, N- or P-doped.

Thus, a sub-cell A implemented in a tandem photovoltaic device according to the invention comprises at least two distinct materials, a substrate made of crystalline, in particular monocrystalline, silicon in particular N-type or P-type doped, on the one hand, and a distinct layer made of N- or P-doped amorphous or polycrystalline silicon. Thus, it differs in particular from a silicon homojunction sub-cell which is based on one single monolithic substrate made of crystalline silicon.

According to a first variant, the tandem photovoltaic device according to the invention may comprise a silicon heterojunction sub-cell A (also called "HET").

According to another variant, it may consist of a sub-cell A in a "TOPCon" type architecture (standing for "Tunnel-Oxide-Passivated Contact").

Such structures will be more specifically detailed in the rest of the text.

Silicon Heterojunction Sub-Cell A:

According to a particular embodiment, the photovoltaic device according to the invention includes a silicon heterojunction sub-cell A. Any type of conventional silicon heterojunction cell may be suitable for the photovoltaic device according to the invention.

In particular, a silicon heterojunction sub-cell A comprises a substrate made of crystalline, for example monocrystalline or polycrystalline, silicon in particular N-type or P-type doped and including, on either side of said substrate, two conductive or semiconductor layers made of amorphous silicon, N and P doped, or highly N$^+$ and P$^+$ doped. Advantageously, an intermediate so-called passivation layer, generally a layer made of intrinsic amorphous silicon, i.e. non-doped, is disposed between the substrate made of silicon and each of the conductive or semiconductor layers.

As represented in FIG. 4, the sub-cell A may more particularly comprise, according to one embodiment, in this stacking order:

a first electrode denoted E1$^A$;

a layer made of N-doped (or P-doped) amorphous silicon;

advantageously, a layer based on intrinsic amorphous silicon, serving as a passivation layer;

a substrate made of crystalline silicon as described before, in particular monocrystalline, in particular N-type doped;

advantageously, a layer based on intrinsic amorphous silicon, serving as a passivation layer;

a layer made of P-doped (or N-doped) amorphous silicon; and optionally, a second electrode E2$^A$.

The first electrode E1$^A$ may be formed of a metallised conductive or semiconductor transparent layer, in particular of transparent conductive oxide(s) (TCO) such as tin-doped indium oxide (ITO), aluminium-doped zinc oxide (AZO), gallium-doped zinc oxide (GZO), indium-doped zinc oxide (IZO) and mixtures thereof, or be formed of a multilayer assembly, for example AZO/Ag/AZO.

It may also be formed of a network of nanowires, in particular made of silver.

For example, the first electrode E1$^A$ may consist of a metallised transparent conductive oxide layer, in particular a metallised ITO layer.

It may have a thickness ranging from 40 to 200 nm, in particular from 50 to 100 nm, for example about 70 nm.

The sub-cell A may comprise a second electrode E2$^A$ when the tandem device has a 4-terminal (4T) structure.

When present, the second electrode E2$^A$ is advantageously formed of a metallised conductive or semiconductor transparent layer, in particular as described for the first electrode E1$^A$. Furthermore, it may have the characteristics mentioned for the first electrode E1$^A$.

The metallisation of the first electrode E1$^A$ and, where appropriate, the second electrode E2$^A$, may be carried out by evaporation of a metal (gold or silver). It may also be carried out by screen-printing or by inkjet. In general, it consists in forming a grid.

Advantageously, the layer made of N-doped amorphous silicon is a layer made of hydrogenated amorphous silicon (denoted "a-Si:H(n)"). It may have a thickness comprised between 1 and 30 nm, in particular between 1 and 10 nm.

Advantageously, the layer made of P-doped amorphous silicon is a layer made of hydrogenated amorphous silicon (denoted "a-Si:H(p)"). It may have a thickness comprised between 1 and 30 nm, in particular between 5 and 15 nm.

More particularly, said passivation layer(s) may be made of hydrogenated amorphous silicon ((i) a-Si:H). They may have, independently of each other, a thickness comprised between 1 and 30 nm, in particular between 5 and 15 nm.

Advantageously, the crystalline silicon ("c-Si") substrate is a silicon monocrystalline substrate, in particular of the N type. In particular, it has a thickness comprised between 50 and 500 nm, in particular between 100 and 300 nm.

The crystalline silicon substrate is positioned between the N-doped amorphous silicon layer ("a-Si:H(n)") and the P-doped amorphous silicon layer ("a-Si:H(p)"), where appropriate between the two passivation layers ("a-Si:H(i)").

Preparation of the Silicon Heterojunction Sub-Cell A:

The silicon heterojunction sub-cell A may be made by methods known to a person skilled in the art.

A silicon heterojunction sub-cell A may be made according to the following steps:

texturing the surface and cleaning a substrate made of crystalline silicon, in particular monocrystalline, possibly N-doped;

advantageously, chemical-mechanical polishing (CMP) at least the face of the substrate made of silicon intended to face the perovskite-based sub-cell B, and cleaning after polishing;

advantageously, depositing a layer based on intrinsic amorphous silicon (a-Si:H(i)) serving as a passivation layer over each of the faces of the substrate made of crystalline, in particular monocrystalline, silicon;

depositing a layer made of N-doped amorphous silicon (a-Si:H(n)) over one of the faces of the substrate made of crystalline silicon, advantageously over the passivation layer;

depositing a layer made of P-doped amorphous silicon (a-Si:H(p)) over the other face of the substrate made of crystalline silicon, advantageously over the passivation layer;

depositing an electronically-conductive layer over the layer made of N-doped (or P-doped) amorphous silicon and metallisation of said electronically-conductive layer, so as to form a first electrode $E1^A$, called the lower electrode;

optionally, depositing an electronically-conductive layer over the layer made of P-doped (or N-doped) amorphous silicon and metallisation of said electrically-conductive layer, so as to form a second electrode $E1^B$, in the case of a structure with four terminals.

Advantageously, the step of cleaning the substrate made of silicon may be carried out by the so-called "Saw Damage Removal" (SDR) technique. It allows avoiding the costly and time-consuming lapping and polishing process, by proceeding with wet etching in an alkaline solution such as potassium hydroxide (KOH) or sodium hydroxide, in order to eliminate damages caused by the saw ("saw damage") on the plates after cutting thereof.

Conventionally, texturing is carried out, after cleaning the substrate through at least one anisotropic etching step using an alkaline solution, such as potassium hydroxide (KOH) or sodium hydroxide (NaOH).

The chemical-mechanical polishing ("CMP") allows obtaining a low surface roughness. Cleaning after polishing allows removing the contamination introduced by polishing, composed of micro- and nano-particles, organic and metallic contamination, without degrading the surface morphology. In general, it is carried out through a wet process. In particular, it may be carried out by successive soaking in a bath under ultrasound of water and isopropyl alcohol at 80° C. and/or UV-Ozone treatment, in particular for a duration ranging from 1 to 60 minutes, in particular about 30 minutes.

The deposition of the different layers made of P-doped or N-doped amorphous silicon may be carried out by plasma-enhanced chemical vapour deposition (PECVD standing for "Plasma Enhanced Chemical Vapour Deposition"), during which a doping gas is introduced in order to dope the layers made of amorphous silicon.

The electronically conductive layer intended to form the first electrode E1A may be deposited by physical vapour deposition ("PVD" standing for "Physical Vapour Deposition"), in particular by sputtering.

The same applies for the formation of the second electrode E1B, when present.

As detailed in the rest of the text, metal contacts are formed afterwards in the context of manufacture of the tandem device over the layer intended to form the first electrode E1A, and possibly, in the context of a 4T structure, over the layer intended to form the second electrode E1B.

Of course, the invention is not limited to the HET sub-cell configuration described before and schematically represented in FIG. 4. Other structures may be considered, for example integrating a passivation layer made of silicon oxide SiOx.

Silicon-Based Sub-Cell a in a TOPCon-Like Structure

According to another particular embodiment, the photovoltaic device according to the invention includes a sub-cell A in a "TOPCon"-type architecture (according to the naming of the Fraunhofer ISE "Tunnel Oxide Passivated Contact", also called "POLO" standing for "POLy silicon on Oxide" according to the naming of the Institute for Solar Energy Research in Hameln (ISFH)) [4]. Any type of known cell of the TopCon type may be suitable for the photovoltaic device according to the invention.

Several TOPCon-type structure variants may be considered.

As represented in FIGS. 5 and 6, a sub-cell A in a TOPCon-type architecture may comprise at least:

a substrate made of N- or P-doped crystalline silicon ("c-Si(n)" or "c-Si(p)"), in particular N-doped;

at the face of the substrate intended to form the rear face of the tandem photovoltaic device (FAR), a layer made of highly N+ ("poly-Si(n+)") or P+ ("poly-Si(p+)") doped polycrystalline silicon, said layer made of highly doped polycrystalline silicon being separated from the substrate by a passivation layer made of an oxide so-called "tunnel oxide", in particular of silicon oxide $SiO_x$ or of aluminium oxide $AlO_x$;

on the side of the opposite face of the substrate, at least one layer made of highly $P^+$ or $N^+$ doped crystalline or polycrystalline silicon of the electrical type opposite to that of the substrate.

It has been demonstrated that the joint use of a layer made of tunnel oxide and a layer made of highly $N^+$ (or $P^+$) doped polycrystalline silicon at the FAR allows having excellent surface passivation as well as an effective transport of charges. Contact is maintained because the passivation layer made of silicon oxide enables the charge carriers (electrons and holes) to pass through by tunnel effect thanks to a quantum phenomenon.

Advantageously, the crystalline silicon substrate is an N-type silicon (c-Si(n)) crystalline substrate. In particular, it may have a thickness comprised between 50 and 500 nm, in particular between 100 and 300 nm.

The silicon substrate is covered successively at its face intended to form the rear face of the photovoltaic device, with a passivation layer and with a layer made of highly doped polycrystalline silicon.

The tunnel oxide layer may be a layer made of $SiO_x$ or of $AlO_x$, in particular of $SiO_2$. Advantageously, it has a thickness comprised between 0.5 and 10 nm, in particular between 1 and 5 nm.

According to a particular embodiment, the layer made of highly doped polycrystalline silicon may be an oxygen- or carbon-rich layer.

According to a particular embodiment, the layer made of highly doped polycrystalline silicon is of the $N^+$ type (poly-Si(n+)).

By "highly doped", it should be understood that the layer has a doping level higher by at least one order of magnitude with respect to the doping level of the substrate. We then talk about $N^+$ or $P^+$ doping in case of high doping instead of N or P in case of doping of the same order of magnitude as that of the substrate. For example, a so-called "highly doped" layer may have a doping with a concentration of electrically-active dopants higher than $10^{17}$ at·cm$^{-3}$, in particular between $10^{17}$ and $10^{22}$ at·cm$^{-3}$, preferably between $10^{19}$ and $10^{21}$ at·cm$^{-3}$.

The layer made of highly doped polycrystalline silicon at the FAR of the device may have a thickness comprised between 5 and 500 nm, in particular between 10 and 250 nm.

According to a first embodiment, as represented in FIG. 5, a sub-cell A in a TOPCon structure, may comprise in this stacking order:

a layer made of highly $N^+$ (or $P^+$) doped polycrystalline silicon "poly-Si(n+)";

a layer, called passivation layer, made of silicon oxide, in particular of SiO$_2$;

a substrate made of N-doped (or P-doped) crystalline silicon "c-Si(n)";

a layer made of highly doped crystalline silicon of the electrical type opposite to that of the substrate $P^+$"c-Si (p+)" (or $N^+$).

In the rest of the text, a sub-cell A having the aforementioned structure will be referred to as "TOPCon 1" structure.

The layers made of highly doped polycrystalline silicon, the passivation layer made of silicon oxide and the substrate made of crystalline silicon may have the previously-described features.

The layer made of highly doped crystalline silicon of the electrical type opposite to that of the substrate $P^+$"c-Si(p+)" (or $N^+$) may have a thickness comprised between 50 nm and 1 μm, in particular between 200 and 700 nm.

As detailed in the rest of the text, a metallisation layer may be formed afterwards on the surface of the layer made of highly doped polycrystalline silicon forming the FAR of the tandem device.

According to another embodiment, as represented in FIG. 6, a sub-cell A in a TOPCon structure may comprise in this stacking order:

a layer made of highly doped polycrystalline silicon N+ "poly-Si(n+)" (or P+);

a layer, called passivation layer, made of silicon oxide, in particular of SiO$_2$;

a substrate made of N-doped (or P-doped) crystalline silicon "c-Si(n)";

a layer, called passivation layer, made of silicon oxide, in particular of SiO$_2$;

a layer made of highly doped polycrystalline silicon of the electrical type opposite to that of the $P^+$ (or $N^+$) substrate "poly-Si(p+)";

a layer of very highly doped polycrystalline silicon of the electrical type opposite to that of the underlying layer made of $N^{++}$ (or $P^{++}$) polycrystalline silicon "poly-Si (n++)".

In the rest of the text, a sub-cell A having the aforementioned structure will be referred to as "TOPCon 2" structure.

The layer made of highly doped polycrystalline silicon, the first passivation layer made of silicon oxide and the substrate made of crystalline silicon may have the previously-described features.

The second passivation layer made of silicon oxide may have the characteristics described before for the first passivation layer.

The layer made of highly $P^+$ (or $N^+$) doped polycrystalline silicon covering the second passivation layer, may have the characteristics, in particular in terms of thickness and doping level, described before for the layer made of highly $N^+$ (or $P^+$) doped polycrystalline silicon located at the FAR of the device.

The layer made of very highly $N^{++}$ (or $P^{++}$) doped polycrystalline silicon is characterised by a higher doping level compared to the doping level of an $N^+$ (or $P^+$) doped layer. In particular, a so-called "very highly doped" layer may have a doping with a concentration of dopants higher than $10^{20}$ at·cm$^{-3}$, in particular comprised between $10^{20}$ and $10^{22}$ at·cm$^{-3}$.

The layer made of very highly $N^{++}$ (or $P^{++}$) doped polycrystalline silicon may have a thickness comprised between 5 nm and 60 nm, in particular between 20 nm and 40 nm.

As described in the rest of the text, in the case of this last variant of the TOPCon type A sub-cell, the sub-cell A and the superimposed perovskite-based sub-cell B may be connected for the preparation of the tandem device with two terminals, without implementing a so-called the recombination layer.

Preparation of the TOPCon-Type Sub-Cell A

A sub-cell with a TOPCon structure, as described before, may be prepared by methods known to a person skilled in the art.

For example, a sub-cell A with a TOPCon 1 structure as described before may for example be made according to the following steps:

texturing the surface and cleaning a substrate made of N-doped (or P-doped) crystalline silicon;

advantageously, polishing at least the face of the substrate made of silicon intended to face the perovskite-based sub-cell B, and cleaning after polishing;

depositing a layer of silicon oxide SiO$_x$, in particular SiO$_2$, serving as a passivation layer at the opposite face of the substrate made of crystalline silicon;

depositing over the passivation layer a layer made of highly $N^+$ (or $P^+$) doped polycrystalline silicon "poly-Si(n+)";

depositing over the face of the substrate opposite to that coated with the passivation layer, a layer made of highly doped crystalline silicon, of the electrical type opposite to that of the substrate made of $P^+$ (or $N^+$) silicon, "c-Si(p+)".

A sub-cell A with a TOPCon 2 structure as described before may be made according to the following steps:

texturing the surface and cleaning a substrate made of N-doped (or P-doped) crystalline silicon;

advantageously, polishing at least the face of the substrate made of silicon intended to face the perovskite-based sub-cell B, and cleaning after polishing;

depositing a layer of silicon oxide SiO$_x$, in particular SiO$_2$, serving as a passivation layer on either side of the substrate made of crystalline silicon;

depositing a layer made of highly $N^+$ doped polycrystalline silicon "poly-Si(n+)" over one of the passivation layers;

depositing a layer made of highly doped polycrystalline silicon, of the electrical type opposite to that of the substrate, $P^+$"poly-Si(p+)" (or $N^+$) over the other passivation layer;

depositing, over the surface of the layer made of highly $P^+$ (or $N^+$) doped polycrystalline silicon, of the electrical type opposite to that of the substrate, a layer made of very highly doped polycrystalline silicon of the electrical type opposite to that of the underlying layer, N$^{++}$ "poly-Si (n++)" (or P$^{++}$).

Advantageously, the preparation steps (texturing, cleaning, chemical-mechanical polishing) may be carried out as described before for the silicon heterojunction sub-cell A.

The passivation layer(s) made of silicon oxide may be formed by thermal or chemical oxidation at the surface of the substrate made of crystalline silicon. The thermal oxidation of the substrate made of crystalline silicon may be carried out in a furnace in the presence of an oxygen-rich atmosphere at moderate temperatures (600-700° C.). The in situ thermal oxidation of the crystalline silicon, directly in the deposition chamber by LPCVD ("Low-Pressure Chemical Vapour Deposition") used for the subsequent deposition of the silicon layer, has also been described. For example, the chemical oxidation of the crystalline silicon may be carried out in hot nitric acid (HNO$_3$) or in a solution of deionised water and ozone (DIO$_3$). More recently, the formation of this passivation layer made of SiO$_x$ by plasma oxidation has also been reported, for example directly in the plasma chemical vapour deposition chamber (PECVD standing for "Plasma Enhanced Chemical Vapour Deposition") used for the subsequent deposition of silicon-based layers. Other dry oxidation processes involving an excimer UV or halogen lamp have also been described.

The layers made of highly P$^+$ or N$^+$ doped or very highly N$^{++}$ or P$^{++}$ doped polycrystalline silicon may be made by chemical vapour deposition (CVD standing for "Chemical Vapour Deposition"), mainly by LPCVD, but also by PECVD. Other methods have also been described, for example by PVD ("Physical Vapour Deposition") or by CVD activated by hot filament.

Perovskite-Based Sub-Cell B:

As indicated before, a photovoltaic device according to the invention includes a perovskite-based sub-cell B successively comprising a lower N-type or of P-type conductive or semiconductor layer and a composite layer according to the invention.

More particularly, the sub-cell B may comprise in this stacking order:

optionally a first electrode E1$^B$;

a lower conductive or semiconductor layer of the N type (denoted "ETL") in the case of a NIP structure or of the P type (denoted "HTL") in the case of a PIN structure;

a composite layer comprising at least one perovskite material and at least one material of the P type in the case of a NIP structure or of the N type in the case of a PIN structure, and having a gradient of the perovskite material/P material mass ratio in the case of a NIP structure or perovskite material/N material mass ratio in the case of a PIN structure, decreasing in the direction from the interface between said composite layer and said lower conductive or semiconductor layer towards the opposite face of said composite layer; and a second electrode, called the upper electrode, E2$^B$, in particular transparent, and more particularly formed of a layer made of transparent conductive oxide, metallised.

Perovskite/P or N Type Material Composite Layer:

The composite layer of the sub-cell B according to the invention comprises, and possibly is formed of at least one perovskite material and of at least one P-type material in the case of a sub-cell with a NIP structure, or of at least one N-type material in the case of a sub-cell with a PIN structure.

The composite layer according to the invention is in direct contact with the underlying conductive or semiconductor layer of N type in a NIP structure and of P type in a PIN structure.

Advantageously, the perovskite is a material including 1, 2 or 3 cations and anions, for example halides, in particular Cl—, Br—, I— and mixtures thereof.

More particularly, the perovskite material of a composite layer according to the invention may be a material of general formula ABX3, with:

A representing a cation or a combination of metallic or organic cations;

B representing one or more metallic element(s), such as lead (Pb), tin (Sn), bismuth (Bi) and antimony (Sb); and X representing one or more anion(s), in particular one or more halide(s), and more particularly selected from among chloride, bromide, iodide and mixtures thereof.

In particular, such perovskite materials are described in the document WO 2015/080990.

As examples of perovskite materials, mention may in particular be made of organic-inorganic hybrid perovskites. More particularly, these hybrid perovskite materials may be of the aforementioned ABX3 formula, wherein A comprises one or more organic or non-organic cation(s).

The organic cation may be selected from among organo-ammonium cations such as:

the alkyl-ammonium cations of general formula R1R2R3R4N+ with R1, R2, R3 and R4 being independently of each other a hydrogen atom or a C1-C5 alkyl radical, such as a methyl-ammonium (MA+) type cation and the formamidinium cations (FA+) of formula [R1NCHNR1]+, with R1 possibly representing a hydrogen atom or a C1-C5 alkyl radical.

The organic cation(s) of the hybrid perovskite material may possibly be combined with one or more metallic cation(s), for example caesium.

As examples of hybrid perovskite materials, mention may more particularly be made of the perovskites of formula ABX$_3$, with:

A representing an organo-ammonium cation, for example of the methyl-ammonium (MA$^+$) type, a formamidinium cation (FA$^+$) or a mixture of these two cations, possibly associated with caesium (Cs$^+$);

B being selected from among lead, tin, bismuth, antimony and mixtures thereof; and X being selected from among chloride, bromide, iodide and mixtures thereof.

In particular, the perovskite material may be CH$_3$NH$_3$PbI$_3$, also called MAPI, with lead being replaceable by tin or germanium and iodine being replaceable by chlorine or bromine.

The perovskite material may also be a compound of formula Cs$_x$FA$_{1-x}$Pb(I$_{1-y}$Br$_y$)$_3$ with x<0.17; 0<y<1 and FA symbolising the formamidinium cation.

In the case of a sub-cell B in a NIP structure, the composite layer according to the invention comprises at least one P-type material.

A "P-type" material refers to a material enabling the transport of holes (h+).

For example, the P-type material may be selected from among Nafion, WO$_3$, MoO$_3$, V$_2$O$_5$ and NiO, $\pi$-conjugated conductive or semiconducting polymers, possibly doped, and mixtures thereof. Preferably, the P-type material is selected from among n-conjugated conductive or semiconducting polymers, possibly doped.

As an illustration of π-conjugated semiconducting polymers, possibly doped, mention may in particular be made of poly(3-hexylthiophene) or P3HT, poly[N-9'-heptadecanyl-2,7-carbazole-alt-5,5-(4,7-di-2-thienyl-2',1',3'-benzothiadiazole or PCDTBT, poly[2,1,3-benzothiadiazole-4,7-diyl[4,4-bis(2-ethylhexyl)-4H-cyclopenta[2,1-b:3,4-b'] dithiophene-2,6-diyl]] or PCPDTBT, poly(benzo[1,2-b:4,5-b']dithiophene-alt-thieno[3,4-c]pyrrole-4,6-dione) or PBDTTPD, poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] or PTB7, poly[bis(4-phenyl)(2,4,6-trimethylphenyl)amine] or PTAA.

Advantageously, the π-conjugated semiconducting polymers may be doped with one or more P-type dopant(s), such as a lithium salt, for example lithium bis(trifluoromethane) sulfonide (LiTFSI) and/or 4-tert-butylpyridine (t-BP).

Also suitable as a P-type material is a poly(3,4-ethylenedioxythiophene) (PEDOT) type conductive material, preferably in a form combined with a counter anion such as PEDOT:PSS.

A preferred P-type material is a mixture of PEDOT and PSS, or PTAA, preferably doped, in particular with a lithium salt, such as lithium bis(trifluoromethane)sulphonide (LiTFSI) and/or 4-tert-butylpyridine.

The P-type material may also be selected from among P-type semiconductor molecules such as:

porphyrin;

the: 7,7'-(4,4-bis(2-ethylhexyl)-4H-silolo[3,2-b:4,5-b 2]dithiophene-2,6-diyl)bis(6-fluoro-4-(5'-hexyl-[2,2'-bithiophen]-5-yl)benzo[c][1,2,5]thiadiazole):p-DTS (FBTTh2)2;

boron-dipyromethenes (BODIPY); and molecules with a triphenylamine (TPA) core.

In the case of a sub-cell B in a PIN structure, the composite layer according to the invention comprises at least one N-type material.

An "N-type" material refers to a material that enables the transport of electrons ($e^-$). More particularly, it may be selected from among metal oxides. For example, the metal oxides may be in the form of metal oxide nanoparticles.

In particular, the N-type metal oxides may be selected from among zinc oxide ZnO, titanium oxides $TiO_x$ with x comprised between 1 and 2, tin oxide ($SnO_2$), doped zinc oxides, for example aluminium-doped zinc oxide (AZO), indium-doped zinc oxide (IZO), gallium-doped zinc oxide (GZO), doped titanium oxides, for example titanium doped with nitrogen, phosphorus, iron, tungsten or manganese, tin oxides doped for example with fluorine, and mixtures thereof.

In particular, the N-type material of the composite layer according to the invention may be selected from among tin oxide ($SnO_2$), doped zinc oxides, in particular aluminium-doped zinc oxide (AZO) and mixtures thereof.

According to one variant, the sub-cell B according to the invention is of the NIP type, and said composite layer comprises, or is formed, of at least one perovskite material and of at least one P-type material, in particular as defined before.

For example, such a sub-cell B is represented in the tandem devices schematically represented in FIGS. 4, 5 and 6.

According to a particular embodiment, a composite layer according to the invention comprises, or is formed of:

a perovskite material of formula ABX3 as defined before, in particular of formula $Cs_xFA_{1-x}Pb(I_{1-y}Br_y)_3$ with x<0.17; 0<y<1 and FA symbolising the formamidinium cation; and a P-type material, as defined before, in particular selected from among n-conjugated conductive or semiconducting polymers, possibly doped, and in particular PTAA, possibly doped with a lithium salt and/or 4-tert-butylpyridine.

Preferably, a composite layer according to the invention has a thickness smaller than or equal to 1 μm, in particular comprised between 200 and 800 nm and more particularly comprised between 300 and 600 nm.

As mentioned before, a composite layer according to the invention has an inhomogeneous distribution of the perovskite and P-type (or N-type) materials.

More specifically, the composite layer has a gradient of the perovskite material/P (or N) material mass ratio, decreasing in the direction from the interface between said composite layer and the underlying conductive or semiconductor layer, towards the opposite face of said composite layer. By "decreasing gradient of the perovskite material/P (or N) material mass ratio", it should be understood a perovskite material/P (or N) material mass ratio decreasing in the direction indicated by the gradient, in other words decreasing according to the invention from the interface between said composite layer and the underlying semiconductor conductive layer up to the opposite face of said composite layer.

In other words, the perovskite material/P (or N) material mass ratio is higher in the vicinity of the interface between said composite layer and the underlying conductive or semiconductor layer than in the vicinity of the opposite face.

In particular, the distribution of the perovskite and P-type (or N-type) materials is such that in the vicinity of the interface between said composite layer and the underlying conductive or semiconductor layer, the composite layer according to invention is primarily formed, or exclusively, of the perovskite material; whereas in the vicinity of the face of said composite layer, opposite to the interface between the composite layer and the underlying conductive or semiconductor layer, in other words, in the vicinity of the interface between the composite layer and the upper electrode, the composite layer according to the invention is primarily formed of the P-type material in the case of a NIP structure or of the N-type material in the case of a PIN structure, in other words is locally of the P type or of the N-type.

More particularly, a composite layer according to the invention comprises an area in which the perovskite material and the P-type (or N-type) material form an interpenetrating structure. In particular, the composite layer according to the invention comprises an area in which said perovskite and P-type (or N-type) materials are mixed at the submicron scale.

More particularly, this interpenetrated area extends over a thickness of at least 10 nm, in particular over a thickness comprised between 10 and 150 nm, of the composite layer according to the invention.

In particular, at this interpenetrated area, said P-type (or N-type) material(s) is/are incorporated into a crystallised perovskite matrix. In other words, the P-type (or N-type) material is coated with perovskite. This structure may be identified by analysis of said composite layer by scanning electron microscopy (SEM), associated with microanalysis by energy dispersive X-rays (EDX).

The crystallised perovskite domains may have an average size larger than 100 nm, in particular larger than 200 nm and preferably, larger than 300 nm. By size, it should be understood the largest dimension of the perovskite domains, for example the diameter for grains with a generally spherical shape.

The average size of the crystallised perovskite domains may be measured by scanning electron microscopy.

Thus, a composite layer according to the invention may more particularly have, in the direction from the interface between said composite layer and the underlying conductive or semiconductor layer towards the face of said composite layer, opposite to the interface between the composite layer and the underlying conductive or semiconductor layer, in other words, towards the interface between the composite layer and the upper electrode ($E_2B$):

a first area primarily formed of the perovskite-type material, or exclusively made up of the perovskite-type material;

an area comprising a mixture of the perovskite and P-type materials in the case of a sub-cell B in a NIP structure or of the N-type in the case of a sub-cell B in a PIN structure; and an area primarily formed, or exclusively made up, of the material of the P type in the case of a sub-cell B in a NIP structure or of the N type in the case of a sub-cell B in a PIN structure.

As mentioned before, the sub-cell B of a photovoltaic device according to the invention advantageously has a so-called "planar" structure. In particular, a composite layer according to the invention is a compact, non-porous layer. Thus, it differs from so-called mesoporous structures, in which a material is incorporated into the pores of another material.

The lower conductive or semiconductor layer, underlying the composite layer according to the invention, of the N type ("ETL") in a NIP structure, or of the P type ("HTL") in a PIN structure, may be formed of one or more N-type, respectively P-type, material(s) as described before for the composition of the composite layer.

Typically, it may have a total thickness comprised between 100 nm and 2 µm, in particular between 400 and 800 nm.

Preferably, sub-cell B of a tandem photovoltaic device according to the invention has a so-called NIP structure. The sub-cell B may then comprise, as schematically represented in FIGS. 4 to 6, in this superimposition order:

optionally a first electrode $E1^B$;

an N-type conductive or semiconductor layer (denoted "ETL"), a perovskite/P material composite layer (denoted "PK: P"), as defined before; and a transparent upper electrode, $E2^B$, in particular formed of a metallised layer made of transparent conductive oxide (TCO).

Alternatively, in the case of a PIN structure, the sub-cell B may comprise in this superimposition order:

optionally a first electrode $E1^B$;

a P-type conductive or semiconductor layer, and a perovskite/N material composite layer, as defined before; and a transparent upper electrode $E2^B$, in particular formed of a metallised layer made of transparent conductive oxide (TCO).

The upper electrode $E2^B$ may be made of a conductive or semiconductor material and metallised. Advantageously, it is made of a material selected from the group of transparent conductive oxides (TCO), for example ITO (indium-tin oxide), AZO (aluminium-zinc oxide), IZO (indium-zinc oxide) or IOH (hydrogenated indium oxide).

According to a particular embodiment, it consists of an upper electrode made of ITO and metallised.

The upper electrode $E2^B$, in particular made of ITO, may have a thickness comprised between 50 and 300 nm, in particular between 100 and 250 nm and more particularly about 200 nm.

When present as is the case in particular for tandem devices with a 4T structure, the first electrode $E1^B$ may be made of a transparent conductive or semiconductor material, and metallised. These may consist of the materials mentioned for the upper electrode $E2^B$. Furthermore, it may have the characteristics, in particular in terms of thickness and metallisation, mentioned for the electrode $E2^B$.

Preparation of the Perovskite-Based Sub-Cell B:

More particularly, making of a sub-cell B according to the invention implements at least the following successive steps:

forming said lower N-type ("ETL") or P-type ("HTL") conductive or semiconductor layer;

forming, on the surface of said lower conductive or semiconductor layer, said composite layer at least via the following steps:

forming, on the surface of said lower conductive or semiconductor layer, a wet film from a solution of precursors of the perovskite material in one or more solvent(s);

(ii) adding to said wet film of step (i) at least one material of the P type in the case of the formation of a NIP stack, and of the N type in the case of a PIN stack; and (iii) subjecting the whole to a heat treatment conducive to the elimination of the solvents and the crystallisation of the perovskite material;

depositing an electronically conductive layer over the composite layer, in particular made of TCO, and metallisation, so as to form a transparent electrode $E2^B$, called the upper electrode.

The lower N-type ("ETL") or P-type ("HTL") conductive or semiconductor layer may be formed of a wet process, i.e. by a technique implementing the deposition of solutions or liquid dispersions. In particular, it may be formed of spin-coating or centrifugal coating (better known as "spin-coating").

Other deposition techniques may be considered. According to one variant, it may be carried out by an atomic layer deposition technique ("Atomic Layer Deposition" or "ALD").

Afterwards, it may be annealed at a temperature comprised between 50 and 200° C., in particular between 80 and 180° C.

Preferably, a composite layer according to the invention is formed of a wet process.

According to a particular embodiment, the formation of said composite layer according to the invention may thus be carried out more particularly at least via the following steps:

(i) depositing, over the surface of said N-type (ETL) or P-type (HTL) conductive or semiconductor layer, a solution of precursors of the perovskite material in one or more solvent(s);

(ii) depositing, over the surface of the wet film formed at step (i), a formulation of at least one material of the P type in the case of a NIP stack, or of the N type in the case of a PIN stack, in one or more solvent(s), called "antisolvents", in which the precursors of the perovskite material are not soluble; and (iii) subjecting the whole to a heat treatment conducive to the elimination of the solvents and the crystallisation of the perovskite material.

Commonly, the term "ink" refers to a solution, dispersion or suspension of material(s) implemented for making layers for a multilayer stack useful for forming a photovoltaic device.

In general, the inks comprise a solvent, one or more material(s) making up the layer, and possibly one or more additive(s), for example a plasticiser and/or a binder and/or a dispersant.

The solution of precursors of the perovskite material, referred to more simply in the rest of the text as "perovskite ink", may typically comprise the precursors of the perovskite material in one or more solvent(s). A person skilled in the art is able to select the nature and the proportions of perovskite precursors to be implemented to obtain the desired perovskite material.

Said solvent(s) is/are selected with regards to the nature of the perovskite precursor(s), so as to enable solubilisation thereof. The solvents are conventionally selected from among polar organic solvents, in particular selected from among dimethylformamide (DMF), dimethyl sulphoxide (DMSO), gamma-butyrolactone (GBL), and mixtures thereof.

Preferably, said solvent(s) for the perovskite ink is/are selected from among DMF, DMSO and mixtures thereof.

The P-type (or N-type) material based formulation, referred to in the rest of the text as "P-type ink" (respectively "N-type ink") typically comprises said P-type (respectively N-type) material(s) in one or more "anti-solvent(s)".

Said solvent(s), called "anti-solvents", is/are solvents so-called "orthogonal" with respect to the precursors of the perovskite material. By solvent "orthogonal" with respect to the precursors of the perovskite material, it should be understood a solvent not capable of dissolving said precursors of the perovskite material. It should be understood that the nature of said anti-solvent(s) is selected with regards to the nature of the perovskite material precursors.

As mentioned before, anti-solvents are conventionally used when making a crystallised layer of perovskite, to carry out the so-called "quenching" phase, subsequent to the deposition of the solution of perovskite precursors. For example, such anti-solvents are described in the publication by Paek et al. [3].

The anti-solvents are typically selected from among diethyl ether; dichloromethane; aromatic compounds with one, two or three ring(s), substituted, in particular substituted by one or more alkyl group(s), in particular methyl, and/or halogen, in particular chlorine, such as toluene, chlorobenzene, xylene, methylnaphthalene; and mixtures thereof.

Preferably, the anti-solvent is toluene.

The concentration of P-type (or N-type) material(s) in the implemented P-type (or N-type) ink may be comprised between 2 g/L and 30 g/L, preferably between 4 g/L and 20 g/L.

The concentrations of perovskite precursors and of P-type or N-type material(s) in the deposited inks are adjusted in particular with regards to the final thickness of the desired composite layer.

The deposition of the inks during the method for preparing a composite layer according to the invention may be carried out by means of a solvent-based deposition technique selected from among spin-coating or centrifugal coating (better known as "spin-coating"), scraper deposition, blade-coating ("blade-coating"), deposition by ultrasonic spray, slot-die coating ("slot-die"), dip-coating ("dip-coating"), inkjet printing, rotogravure, flexography and screen-printing.

According to one variant, the perovskite ink and/or the P-type (or N-type) ink is (are) deposited by spin-coating.

Preferably, the perovskite ink and the P-type (or N-type) ink are deposited by the same deposition technique, advantageously by spin-coating.

It is within the competences of a person skilled in the art to adjust the conditions for depositing said P-type (or N-type) ink, over the wet film of perovskite precursor solution, to obtain, after thermal annealing, said desired composite layer, as described before.

By "wet film", it should be understood that the film over which the P-type (or N-type) ink is deposited comprises one or more solvent(s). In other words, the deposition of the P-type (or N-type) ink is carried out before the total elimination of said solvent(s) from the previously deposited perovskite ink film.

According to a particular embodiment, steps (i) and (ii) of the method of the invention may be carried out consecutively by spin-coating, step (ii) being carried out without stopping the rotation of the rotating platform of the spin coater.

More particularly, according to this variant, the structure having on the surface an N-type (or P-type) conductive or semiconductor layer is fastened to the sample holder of the spin coater. Afterwards, the solution of perovskite precursors is deposited over the surface of said N-type (or P-type) layer, then the substrate is rapidly rotated by the spinner, to form a thin and even film of the perovskite ink. The formulation of P-type (or N-type) material(s) in one or more anti-solvent (s) is then drained onto the surface of the wet film of the perovskite ink, without stopping the rotation.

For example, the deposition by spin-coating in step (i) and (ii) may be carried out with a rotational speed comprised between 500 and 8,000 rpm. For example, the P-type (or N-type) ink may be deposited over the surface of the wet film of the solution of perovskite precursors between 5 and 35 seconds, in particular between 5 and 20 seconds before the end of the deposition program of the solution of perovskite precursors.

It is up to a person skilled in the art to adjust the parameters of the deposition, in particular in terms of the time elapsed between the deposition of the solution of perovskite precursors by spin-coating and the deposition of the P-type or N-type ink, to access, after annealing, a composite layer according to the invention. In particular, the P-type or N-type ink is deposited after formation, at the surface of the lower conductive or semiconductor layer, of a wet film of the solution of perovskite precursors (perovskite ink), with a homogeneous thickness, and before evaporation of the solvent(s) of the deposited perovskite ink.

The elimination of the solvents may be carried out in a conventional manner, for example by thermal drying.

Afterwards, the whole heated to crystallise the perovskite material. It is up to a person skilled in the art to adjust the thermal annealing conditions to obtain the desired perovskite material. In particular, the thermal annealing may be carried out at a temperature comprised between 60 and 150° C., in particular between 80 and 120° C. The duration of the annealing may be comprised between 5 and 120 minutes, in particular between 15 and 90 minutes and more particularly between 30 and 60 minutes.

The electronically conductive layer intended to form the upper electrode E2B may be deposited by physical vapour deposition ("PVD" standing for "Physical Vapour Deposition"), in particular by sputtering.

Advantageously, the formation of the upper electrode $E2^B$ is carried out without preheating to limit as much as possible the degradation of the underlying composite layer.

Tandem Photovoltaic Device:

A tandem photovoltaic device according to the invention comprises a sub-cell A as described before, based on silicon, in particular selected from among silicon heterojunction sub-cells and sub-cells in a TOPCon-type architecture, over which is stacked a perovskite-based sub-cell B as described before, comprising in particular a composite layer associating at least one perovskite material and at least one N-type or P-type material.

The invention also relates to a method for manufacturing a tandem photovoltaic device according to the invention, in particular a tandem photovoltaic cell according to the invention, comprising at least the following steps:

making a silicon-based sub-cell A according to the invention, as defined before, in particular with silicon heterojunction or in a TOPCon-type architecture as described before;

(b) making a perovskite-based sub-cell B as defined before, wherein said composite layer is formed at the surface of said lower N-type or P-type conductive or semiconductor layer, at least via the previously-described steps (i) to (iii).

Advantageously, the composite layer of the sub-cell B faces the electromagnetic radiation and therefore the incident photons.

The invention will be described more particularly in the rest of the text with reference to a structure with two terminals (2T), wherein the sub-cells A and B are placed in series. Of course, the invention is not limited to 2T tandem devices and other structures may be considered, for example a structure with four terminals (4T).

As described more specifically in the rest of the text, the method for manufacturing a tandem photovoltaic device according to the invention, with a 2T structure, may more particularly comprise forming on the surface of the silicon-based sub-cell A and prior to making of said perovskite-based sub-cell B, an electronically conductive layer, also called the recombination layer.

HET/PK Tandem Device:

According to a first variant, the tandem photovoltaic device according to the invention comprises a silicon heterojunction sub-cell A and a perovskite-based sub-cell B. Such a tandem device is more simply referred to as the "HET/PK tandem device".

In the case of a 2T HET/PK tandem device, the sub-cells A and B are then placed in series. Thus, the tandem photovoltaic device comprises one single first electrode, the lower electrode $E1^A$ of the sub-cell A and one single second electrode, the upper electrode of the sub-cell B $E2^B$.

In this case, the sub-cells A and B are separated by an electronically conductive or semiconductor layer, also called the recombination layer (denoted RC).

Thus, in a 2T structure, the upper amorphous silicon-based layer of the P-doped (a-SiH(p)) (or N-doped) (a-SiH (n)) sub-cell A and the lower conductive or semiconductor layer of the sub-cell B, of the N type (ETL) in the case of a NIP structure or of the P type (HTL) in the case of a PIN structure, are separated by a recombination layer (RC).

The recombination layer may have a small thickness, typically comprised between 1 and 20 nm, in particular between 1 and 15 nm and more particularly about 12 nm.

The recombination layer is intended to electrically contact the P-doped or N-doped amorphous silicon layer of the lower sub-cell A and the N-type or P-type conductive or semiconductor layer of the upper sub-cell B, without the charges having to cross a PN junction opposing their transport.

Advantageously, the recombination layer of a tandem device in a 2T structure according to the invention is transparent to the electromagnetic radiation. In particular, it may be made of a material selected from the group of TCOs (transparent conductive oxides) including ITO (Indium Tin Oxide), AZO (Aluminium Zinc Oxide), IZO (Indium Zinc Oxide), IOH (Hydrogenated Indium Oxide), AZO/Ag/IZO, IZO/Ag/IZO, ITOH, IWO, IWOH (indium-tungsten oxide with or without hydrogen), ICO, ICOH (indium-cesium oxide with or without hydrogen), and silver nanowires. It may also consist of GZO (gallium-doped zinc oxide).

According to a particular embodiment, the intermediate layer is made of ITO.

The recombination layer of a HET/PK tandem device according to the invention, in particular the ITO recombination layer, may have a thickness comprised between 1 and 20 nm, in particular between 1 and 15 nm, for example about 12 nm.

Advantageously, the recombination layer comprises as little oxygen as possible to maximise the concentration of carriers to promote recombinations.

For example, a tandem photovoltaic device in a 2T structure according to the invention may thus more particularly comprise, in this superimposition order, at least:

a sub-cell A as described before, comprising in this superimposition order:

a first electrode denoted $E1^A$, in particular formed of a metallised conductive transparent layer;

a layer made of N-doped (or P-doped) amorphous silicon, preferably of N-doped hydrogenated amorphous silicon "a-SiH (n)" (or P-doped "a-SiH (p)");

advantageously, a layer based on intrinsic amorphous silicon, preferably hydrogenated "a-SiH(i)" serving as a passivation layer;

a substrate made of crystalline silicon, in particular monocrystalline ("c-Si"), and in particular N-doped;

advantageously, a layer based on intrinsic amorphous silicon, preferably hydrogenated "a-SiH(i)" serving as a passivation layer;

a layer made of P-doped (or N-doped) amorphous silicon, preferably of P-doped hydrogenated amorphous silicon "a-SiH (p)" (or N-doped "a-SiH (n)");

an electronically conductive or semiconductor intermediate layer, called "recombination layer";

a sub-cell B as described before comprising in this superimposition order:

an N-type "ETL" (or P-type "HTL") conductive or semiconductor layer, and a perovskite/P material "PK:P" (or N material "PK:N") composite layer according to the invention, as defined before;

a second electrode, called the upper electrode $E2^B$, in particular formed of a metallised transparent conductive oxide layer.

According to a particular embodiment, as illustrated in FIG. 4, a tandem photovoltaic device in a 2T structure according to the invention comprises the $E1^A$/a_SiH (n)/a-SiH (i)/c-Si/a-SiH (i)/a-SiH (p)/RC/ETL/PK:P/$E2^B$ stack.

It should be understood that the layers of this stack may have the characteristics described before for each of these layers.

The first electrode E1$^A$ and the second electrode E2$^B$ may be associated with a metal grid in order to promote external electrical contacts. In particular, this grid may be made of silver or copper.

The invention also relates to a method for manufacturing a HET/perovskite tandem photovoltaic device with two terminals, in particular as described before, comprising at least the following steps:

1/making a silicon heterojunction sub-cell A containing:
   a first electrode denoted E1$^A$, in particular metallised;
   a layer made of N-doped (or P-doped) amorphous silicon, preferably of N-doped hydrogenated amorphous silicon "a-SiH (n)" (or P-doped "a-SiH (p)");
   advantageously, a layer based on intrinsic amorphous silicon, preferably hydrogenated "a-SiH(i)" serving as a passivation layer;
   a substrate made of crystalline silicon, in particular monocrystalline ("c-Si"), and in particular N-doped;
   advantageously, a layer based on intrinsic amorphous silicon, preferably hydrogenated "a-SiH(i)" serving as a passivation layer;
   a layer made of P-doped (or N-doped) amorphous silicon, preferably of P-doped hydrogenated amorphous silicon "a-SiH (p)" (or N-doped "a-SiH (n)");

2/forming, on the upper amorphous silicon layer of the P-doped (or N-doped) sub-cell A, an electronically conductive or semiconductor intermediate layer (denoted "RC"), called the recombination layer;

3/making a perovskite-based sub-cell B according to the following steps
   forming, on said recombination layer RC, a N-type "ETL" (or P-type "HTL") conductive or semiconductor layer, called the lower layer;
   forming on the surface of said lower conductive or semiconductor layer, a perovskite/P material "PK:P" (or N material "PK:N") composite layer according to the invention, according to the previously-described steps (i) to (iii);
   forming, on said composite layer, a second electrode, called the upper electrode, E2$^B$, in particular metallised.

A person skilled in the art is able to adapt the order of the different steps for manufacturing a two-terminal tandem cell.

More particularly, the silicon heterojunction sub-cell A may be prepared according to the previously-described steps.

The recombination layer, in particular made of indium-tin oxide (ITO) may be formed of PVD deposition (cathode sputtering).

Advantageously, the PVD deposition of the thin recombination layer, in particular made of ITO, is carried out before that of the electrically conductive layer, which is thicker, in particular made of ITO.

Advantageously, the recombination layer is subjected at its face intended to support the N-type or of P-type conductive or semiconductor layer of the upper perovskite-based sub-cell B, to a prior UV-Ozone treatment, in particular for a duration ranging from 1 to 60 minutes, in particular about 30 minutes.

The perovskite-based sub-cell B may be formed according to the previously-described steps.

Advantageously, the face of the PK:P or PK:N composite layer formed according to the invention is covered, prior to the formation of the upper electrode E2$^B$, with a thin metallic layer (gold or silver) in particular 0.1 to 1 nm thick, so as to improve the transport at the interface of the composite layer and the upper electrode.

The metallisation of the electrode E1$^A$ (intended to form the rear face "FAR" of the tandem device) and of the upper electrode E2$^B$ (intended to form the front face "FAV" of the tandem device), may be carried out by evaporation of a metal (gold or silver). It may also be carried out by screen-printing or by inkjet. In general, it consists in forming a grid.

In the case of making by screen-printing, this step is carried out only at the end of the manufacture of the tandem device, simultaneously for the metallisation of the front face and the rear face of the device. The metallisations at the front face and at the rear face are deposited and annealed together.
TopCon/PK Tandem Device:

According to another variant, the tandem photovoltaic device according to the invention comprises a sub-cell A with a TOPCon-type structure and a perovskite-based sub-cell B. Such a tandem device is more simply referred to as a "TOPCon/PK tandem device".

For example, the sub-cell A may have one of the two architectures "TOPCon 1" and "TOPCon 2" detailed before.

For example, a TOPCon/PK tandem photovoltaic device in a 2T structure according to the invention may comprise, in this superimposition order, at least:
   a sub-cell A as described before, comprising in this superimposition order:
   a metallisation layer;
   a layer made of highly N$^+$ (or P$^+$) doped polycrystalline silicon "poly-Si(n+)";
   a so-called passivation layer, for example made of silicon oxide, in particular of SiO$_2$;
   a substrate made of N-doped (or P-doped) crystalline silicon "c-Si(n)";
   a highly doped crystalline silicon layer of the electrical type opposite to that of the P$^+$ (or N$^+$) substrate "c-Si(p+)"
   an electronically conductive or semiconductor intermediate layer, called "recombination layer";
   a sub-cell B as described before comprising in this superimposition order:
   an N-type "ETL" (or P-type "HTL") conductive or semiconductor layer, and
   a perovskite/P material "PK:P" (or N material "PK:N") composite layer according to the invention, as defined before;
   a second electrode, called the upper electrode E2$^B$, in particular metallised.

According to one embodiment, as illustrated in FIG. 5, a TOPCon/PK tandem photovoltaic device in a 2T structure according to the invention comprises the poly-Si (n+)/SiO$_2$/c-Si (n)/c-Si (p+)/RC/ETL/PK:P/E2$^B$ stack, the metallisations not being represented.

It should be understood that the layers of this stack may have the characteristics described before for each of these layers.

Advantageously, the recombination layer is made of transparent conductive oxide(s) (TCO), in particular as described before for the recombination layer of a HET/PK tandem device in a 2T structure.

For example, it may be made of indium-tin oxide (ITO), aluminium-doped zinc oxide (AZO), gallium-doped zinc oxide (GZO), indium-doped zinc oxide (IZO) and mixtures thereof, or be formed of a multilayer assembly, for example AZO/Ag/AZO.

The upper electrode E2$^B$ may be associated with a metal grid as described in the context of the HET/perovskite devices.

According to another embodiment, a TOPCon/PK photovoltaic device in a 2T structure may comprise a sub-cell A in a TOPCon 2 type architecture as described before and a perovskite-based sub-cell B as described before.

For example, a TOPCon/PK photovoltaic device in a 2T structure according to the invention may comprise, in this superimposition order, at least:

a sub-cell A as described before, comprising in this superimposition order:

a metallisation layer;

a layer made of highly N+ (or P+) doped polycrystalline silicon "poly-Si(n+)";

a so-called passivation layer, for example made of silicon oxide, in particular of $SiO_2$;

a substrate made of N-doped (or P-doped) crystalline silicon "c-Si(n)";

a so-called passivation layer, for example made of silicon oxide, in particular of $SiO_2$;

a layer made of highly doped polycrystalline silicon of the electrical type opposite to that of the $P^+$ (or $N^+$) substrate "poly-Si(p+)";

a layer made of very highly doped polycrystalline silicon of the electrical type opposite to that of the underlying layer made of $N^{++}$ (or $P^{++}$) polycrystalline silicon "poly-Si(n++)";

a sub-cell B as described before comprising in this superimposition order:

an N-type "ETL" (or P-type "HTL") conductive or semiconductor layer, and a perovskite/P material "PK:P" (or N material "PK:N") composite layer according to the invention, as defined before;

a second electrode, called the upper electrode $E2^B$, in particular metallised.

According to one embodiment, as illustrated in FIG. 6, a TOPCon/PK tandem photovoltaic device in a 2T structure according to the invention comprises the poly-Si (n+)/$SiO_2$/ c-Si (n)/$SiO_2$/poly-Si (p+)/poly-Si (n++)/ETL/PK:P/$E2^B$ stack, the metallisations not being represented.

It should be understood that the layers of this stack may have the characteristics described before for each of these layers.

Advantageously, as described in the rest of the text, in the case of this last variant of the TOPCon-type sub-cell A, the sub-cell A and the superimposed perovskite-based sub-cell B may thus be connected for the preparation of the tandem device with two terminals, without implementing a so-called the recombination layer.

The upper electrode $E2^B$ may be associated with a metal grid as described in the context of the HET/perovskite devices.

The invention also relates to a method for manufacturing a TOPCon/perovskite tandem photovoltaic device with two terminals, in particular as described before, comprising at least the following steps:

1/making a silicon-based sub-cell A in a TOPCon-type architecture, in particular as described before, comprising:

a metallisation layer;

a layer made of highly $N^+$ (or $P^+$) doped polycrystalline silicon "poly-Si(n+)";

a layer, called passivation layer, made of silicon oxide, in particular of $SiO_2$;

a substrate made of N-doped (or P-doped) crystalline silicon "c-Si(n)"; and in the case of a TOPCon 1 structure:

a highly doped crystalline silicon layer of the electrical type opposite to that of the $P^+$ (or $N^+$) substrate "c-Si(p+)";

or, in the case of a TOPCon 2 structure:

a layer, called passivation layer, made of silicon oxide, in particular of $SiO_2$;

a layer made of highly doped polycrystalline silicon of the electrical type opposite to that of the $P^+$ (or $N^+$) substrate "poly-Si(p+)";

a layer made of very highly doped polycrystalline silicon of the electrical type opposite to that of the underlying layer made of $N^+$ (or $P^+$+) polycrystalline silicon "poly-Si(n++)".

2/possibly, in particular in the case of a "TOPCon 2" structure, forming, on the layer made of highly $P^+$ doped (or $N^+$ doped) crystalline silicon, an electronically conductive or semiconductor intermediate layer, called the recombination layer, advantageously indium-free;

3/making a perovskite-based sub-cell B according to the following steps:

forming on the upper layer of the sub-cell A, in particular on said layer made of very highly $N^{++}$ (or $P^{++}$) doped polycrystalline silicon in the case of a TOPCon 1 structure, or, if it exists, on the recombination layer, in particular in the case of a TOPCon 2 structure, an N-type "ETL" (or P-type "HTL") conductive or semiconductor layer, called the lower layer;

forming on the surface of said lower conductive or semiconductor layer, a perovskite/P material "PK:P" (or N material "PK:N") composite layer according to the invention, according to the previously-described steps (i) to (iii);

forming, on said composite layer, an electrode, called the upper electrode, $E2^B$, in particular metallised.

A person skilled in the art is able to adapt the order of the different steps for manufacturing a two-terminal tandem cell.

The sub-cell A with a TOPCon structure may be prepared according to the previously-described steps.

The metallisation layer (intended to form the FAR of the tandem device) may be formed of deposition by screen-printing of an aluminium paste, on the surface of the layer of highly $N^+$ (or $P^+$) doped polycrystalline silicon "poly-Si (n+)", followed by rapid annealing at high temperature.

When present, the recombination layer, in particular made of ITO, may be formed of PVD deposition (cathode sputtering).

Advantageously, the recombination layer is subjected, at its face intended to support the N-type or P-type conductive or semiconductor layer of the upper sub-cell B, to a prior UV-Ozone treatment, in particular for a duration ranging from 1 to 60, in particular about 30 minutes.

The perovskite-based sub-cell B may be formed according to the previously-described steps.

The metallisation of the upper electrode $E2^B$ (intended to form the front face of the tandem device), may be carried out as previously described for the HET/perovskite tandem device.

Of course, the tandem photovoltaic devices according to the invention may further include electrical connection means, which allow connecting the electrodes to supply an electrical circuit with current.

The tandem photovoltaic device may further comprise an anti-reflection coating on the surface, for example made of $MgF_2$. For example, the anti-reflection coating may have a thickness comprised between 50 and 200 nm, in particular between 90 and 110 nm, for example about 100 nm.

The invention will now be described by means of the following examples, given of course as a non-limiting illustration of the invention.

EXAMPLE

Efficiency Test of a Perovskite/P Material Composite Layer:

The efficiency of a perovskite/P material composite layer is tested on a single-junction photovoltaic cell.

Formulation of a Perovskite+P Material Composite Layer:

The P-type material is poly[bis(4-phenyl)(2,4,6-trimethylphenyl)amine].

Starting from a PTAA commercial powder (Mw of about 14,500 g/mol), a PTAA formulation is prepared at a concentration of 12 g/L in anhydrous toluene.

This PTAA formulation is completed by the addition, for 1.5 mL of the solution of PTAA in toluene, of 15.75 μL of a solution of Li-TFSI at 170 g/L in acetonitrile and of 8.4 μL of 4-tert-butylpyridine (t-BP).

A 1.1 mm thick glass substrate, covered with an ITO layer forming the lower electrode, is covered with an N layer of tin oxide ($SnO_2$). The N layer is formed of spin-coating ("spin-coating").

A perovskite ink, formed of the precursors $PbI_2$, $PbBr_2$, CsI and FAI in a mixture of DMF and DMSO, is deposited at the surface of the $SnO_2$ layer by spin-coating. Without stopping the rotation of the structure, the PTAA solution, prepared hereinabove (250-350 μl) is deposited at the surface of the structure.

Thus, the PTAA solution serves as a "quenching" formulation of the perovskite. Afterwards, the film thus "quenched" is annealed for one hour at 100° C. to form the perovskite $Cs_{0.05}FA_{0.95}Pb(I_{0.83}Br_{0.17})_3$/PTAA composite layer.

The perovskite+PTAA composite layer has a thickness of about 400 nm.

The analysis of the composite layer by ToF-SIMS analysis allows identifying an increasing concentration of the perovskite material and a decreasing concentration of the P-type material, from the free surface of the formed composite layer up to the interface between the composite layer and the underlying N layer. In particular, three areas may be distinguished, from the interface between the formed composite layer and the underlying N layer up to the free surface of the composite layer: a first area primarily formed of the perovskite material, an area comprising a mixture of the perovskite material and of the P-type material and an area primarily formed of the P-type material.

Assessment of the Performances of the Device:

Afterwards, an upper electrode (gold layer, 100 nm thick) is evaporated at the surface of the perovskite+PTAA composite layer.

The entire device is made in a glove box under an internal atmosphere. The active surface of the NIP-type device thus formed, with a Glass/ITO/N layer perovskite+PTAA composite/Au structure, is 0.33 cm².

The photovoltaic performances of the device have been measured at 25° C. under standard lighting conditions (1,000 W·m⁻², AM 1.5 G).

The characteristic parameters of the operation of the device (open-circuit voltage Voc, short-circuit current density Jsc, form factor FF and power conversion efficiency PCE) are determined from these curves.

The obtained results are reported in Table 1 hereafter.

TABLE 1

| Device | Voc (mV) | Jsc (mA/cm²) | FF (%) | PCE (%) |
|---|---|---|---|---|
| In accordance with the invention (with a perovskite + PTAA composite layer) | 1,048 | 19.7 | 69.7 | 14.4 |

This test shows the effectiveness of the implementation of a perovskite/P material composite layer as a substitute for a perovskite-P material bilayer structure.

Making of a HET/Perovskite Tandem Cell According to the Invention:

A HET/perovskite tandem cell as represented in FIG. 4 and whose perovskite-based sub-cell incorporates a composite layer according to the invention may be prepared according to the following manufacturing process:

Cleaning by SDR ("saw damage removal") and texturing (with KOH) of a silicon wafer;

Chemical-mechanical polishing (CMP) of one face of the wafer to facilitate the homogeneity of the liquid depositions of the upper sub-cell;

Post-CMP cleaning: successive soaking in ultrasound baths of water and IPA at 80° C. UV-Ozone treatment: 30 minutes;

PEVCVD deposition of the non-doped (i) and (n) and (p) type (excess of electrons and holes respectively) doped amorphous silicon layers;

Thickness of the layers (i): between 5 and 15 nm; of the layer (n): between 1 and 10 nm; of the layer (p): between 5 and 15 nm.

PVD (cathode sputtering) deposition of two layers of indium-doped tin oxide (ITO):

0.70 nm over the textured rear face (FAR), therefore over the a-Si(n) layer in a NIP architecture;

0.12 nm over the other CMP polished face, therefore over the a-Si(p) layer in a NIP architecture, this layer being intended to form the recombination layer.

FAR metallisation by silver evaporation: 200 nm. This metallisation step is done only at the end of the manufacture of the devices in the case where it is carried out by screen-printing. The FAV and FAR metallisation are then deposited by screen-printing and annealed together.

UV-Ozone treatment on the face covered by the recombination ITO: 30 minutes;

In glove box:

Deposition of the $SnO_2$ layer by spin-coating starting from a solution of $SnO_2$ in water. Afterwards, the layer is annealed for 1 minute at 80° C. on a hot plate. The formed N layer (ETL) may be 40 nm.

Deposition of the perovskite/PTAA composite layer as described in the previous test carried out in single junction. The perovskite may be a compound of formula $Cs_xFA_{1-x}Pb(I_{1-y}Br_y)_3$ with x<0.17; 0<y<1 and FA symbolising the formamidinium cation;

Au, 0.2 nm, evaporation. This layer is intended to improve transport at the composite layer/ITO interface;

PVD deposition of the ITO in FAV: 200 nm, without preheating to limit as much as possible the degradation of the heat-sensitive layers;

Evaporation of the Au contacts: 200 nm (unless the contacts are made by screen-printing).

ToF-Sims Analysis:

On the one hand, a conventional stack comprising PTAA and perovskite layers and, on the other hand, a PTAA/perovskite composite layer according to the invention are prepared and then analysed by time-of-flight secondary ion mass spectrometry (ToF-SIMS) in depth.

The depth profiles are obtained by alternating analysis and abrasion sequences.

The analysis of the emitted secondary ions $C_6H_6^-$ and $Pb^-$ is representative, respectively, of the presence of the PTAA and of the perovskite.

Figure 7:
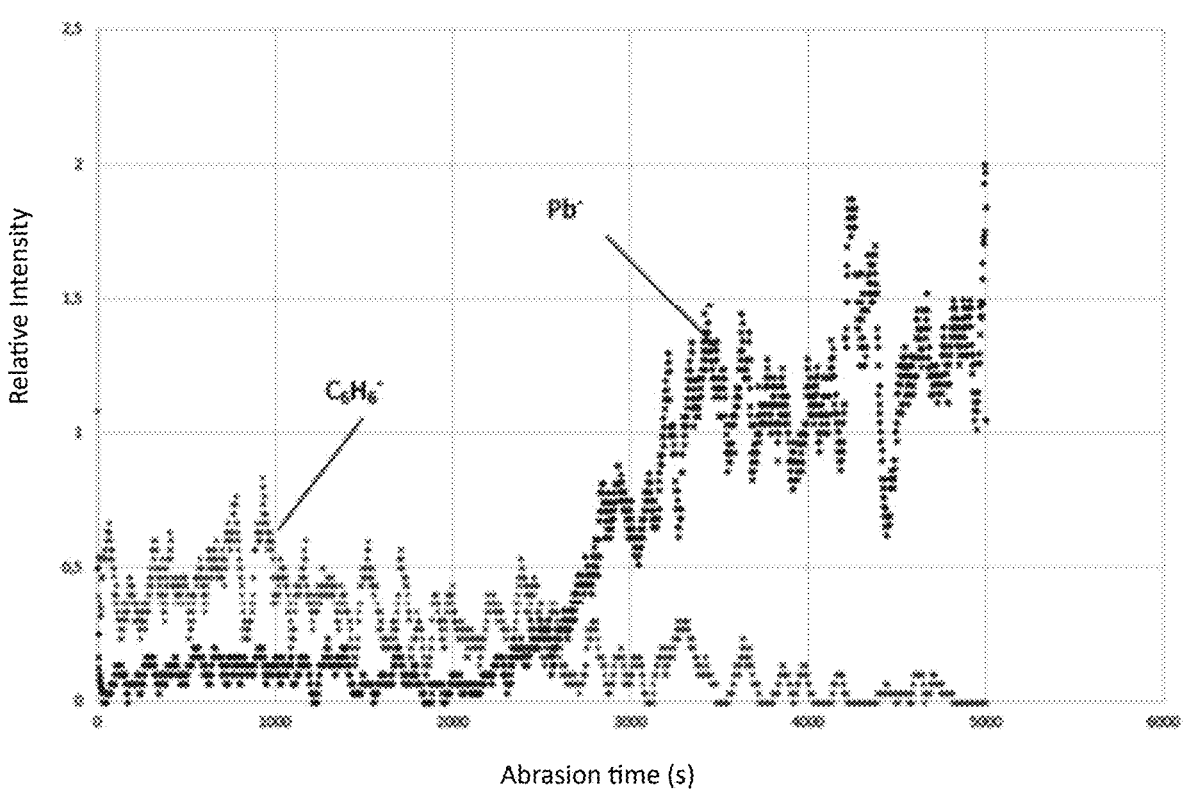
FIG. 7 shows the ToF-SIMS analysis curves for the $C_6H_6^-$ ions, PTAA markers, and for the $Pb^-$ ions, perovskite markers, obtained for the PTAA and perovskite layers of a conventional multilayer stack.

The ToF-SIMS analysis curves for the $C_6H_6^-$ and $Pb^-$ ions of the PTAA and perovskite layers of the conventional stack are schematically represented in FIG. 7. The ToF-SIMS analysis clearly identifies an upper PTAA ($C_6H_6^-$ ions detected) layer, followed by a perovskite ($Pb^-$ ions detected) layer.

Figure 8:
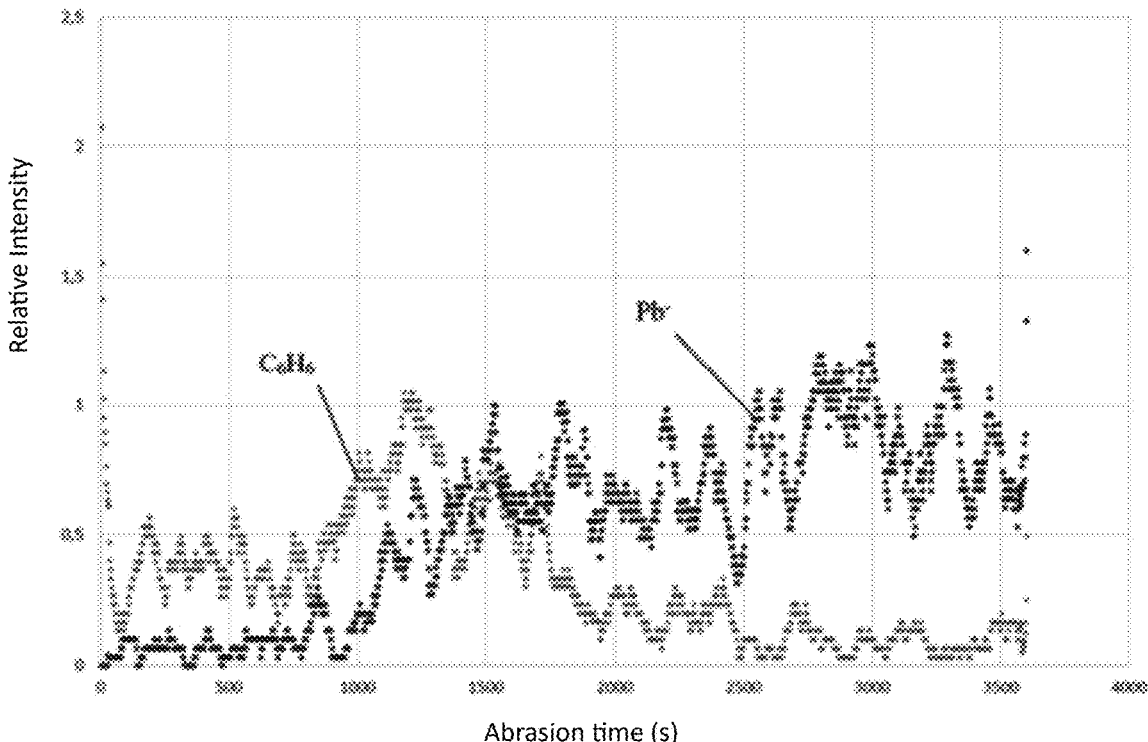
FIG. 8 shows the ToF-SIMS analysis curves for the $C_6H_6^-$ and $Pb^-$ ions obtained for the perovskite/PTAA composite layer according to the invention.

The ToF-SIMS analysis curves for the $C_6H_6^-$ and $Pb^-$ ions of the perovskite/PTAA composite layer of the stack according to the invention are schematically represented in FIG. 8.

The ToF-SIMS analysis allows identifying an increasing concentration of the perovskite material ($Pb^-$ ions detected) and a decreasing concentration of the P-type material ($C_6H_6^-$ ions), from the free surface of the formed composite layer up to the interface between the composite layer and the underlying N layer. In particular, three areas may be distinguished, from the interface between the formed composite layer and the underlying N layer up to the free surface of the composite layer: a first area primarily formed of the perovskite material, an area comprising a mixture of the perovskite material and of the P-type material and an area primarily formed of the P-type material.

LIST OF THE MENTIONED DOCUMENTS

Rong et al., Science 361, 1214 (2018);
Xiao et al., Angew. Chem. 2014, 126, 1-7;
Paek et al., Chem. Mater. 2017, 29, 3490-3498;
Allen et al., *Nature Energy,* 4(11), 914-928.

What is claimed is:

1. A tandem photovoltaic device, comprising, in this superimposition order:

A/a silicon-based sub-cell A comprising at least:
  a substrate made of crystalline silicon; and
  at least one layer, distinct from said substrate, made of N- or P-doped amorphous or polycrystalline silicon;
and B/a perovskite-based sub-cell B, comprising at least:
  a lower layer, said lower layer being a semi-conductor layer of the N type in the case of a NIP structure, or being of the P type in the case of a PIN structure, and
  a composite layer, arranged on and in direct contact with said lower layer, said composite layer comprising at least one perovskite material and at least one second material, said composite layer having a gradient of the at least one perovskite material/at least one second material mass ratio, decreasing in a direction from an interface between a first face of said composite layer and said lower layer towards a second face of said composite layer opposite said first face of said composite layer, the at least one second material being a semi-conductor of the P type in the case said lower layer is of the N type or the at least one second material being a semi-conductor of the N type in the case said lower layer is of the P-type,
the perovskite-based sub-cell B having a planar structure.

2. The tandem photovoltaic device according to claim 1, wherein said sub-cell A is a silicon heterojunction sub-cell or a TOPCon-type architecture sub-cell.

3. The tandem photovoltaic device according to claim 1, wherein said sub-cell A is a silicon heterojunction sub-cell comprising, in this stacking order:
  a first electrode $E1^A$;
  said at least one layer made of N-doped or P-doped amorphous silicon;
  said substrate made of crystalline silicon;
  a second layer made of P-doped or N-doped amorphous silicon; and
  optionally, a second electrode $E2^A$.

4. The tandem photovoltaic device according to claim 1, wherein said sub-cell A is a TOPCon-type architecture sub-cell, and wherein said substrate is made of N- or P-doped crystalline silicon, the sub-cell A comprising, in this stacking order:
  at a face of the substrate intended to form the rear face of the tandem photovoltaic device, said at least one layer made of N- or P-doped amorphous or polycrystalline silicon, where said at least one layer is a layer made of highly $N^+$ or $P^+$ doped polycrystalline silicon, said layer made of highly $N^+$ or $P^+$ doped polycrystalline silicon being separated from said substrate by a passivation layer made of a tunnel oxide;
  said substrate; and
  on the side of the opposite face of the substrate, at least one layer made of electrical-type highly P+ or N+ doped crystalline or polycrystalline silicon.

5. The tandem photovoltaic device according to claim 1, wherein said perovskite-based sub-cell B comprises, in this stacking order:
  optionally a first electrode $E1^B$;
  said lower layer;
  said composite layer; and
  a second electrode $E2^B$.

6. The tandem photovoltaic device according to claim 1, wherein said at least one perovskite material and said at least one second material form within the composite layer of said perovskite-based sub-cell B, over a thickness of at least 10 nm, an interpenetrating structure, said interpenetrating structure being composed of said at least one second material incorporated into a crystallised perovskite matrix.

7. The tandem photovoltaic device according to claim 1, wherein said gradient of said composite layer comprises:
  a first area primarily formed of a perovskite-type material, or exclusively made up of the perovskite-type material;
  an area comprising a mixture of the at least one perovskite material and the at least one second material; and
  an area formed primarily of the at least one second material.

8. The tandem photovoltaic device according to claim 1, wherein the interface between the composite layer and an underlying lower layer at the sub-cell B forms a planar junction.

9. The tandem photovoltaic device according to claim 1, wherein said composite layer has a thickness less than or equal to 1 μm.

10. The tandem photovoltaic device according to claim 1, wherein the at least one perovskite material of said composite layer is of formula $ABX_3$, with:
  A representing a cation or a combination of metallic or organic cations;
  B representing one or more metallic element(s), chosen among lead, tin, bismuth and antimony; and
  X representing one or more halide anion(s).

11. The tandem photovoltaic device according to claim 1, wherein when said sub-cell B is:

of the NIP structure, said P-type material being selected from among π-conjugated conductive or semiconducting polymers; or of the PIN structure, said N-type material being selected from among N-type metal oxides.

12. The tandem photovoltaic device according to claim 3, said device being of a HET/perovskite type with a 2T structure, comprising, in this superimposition order, at least:

the sub-cell A comprising in this superimposition order:

said first electrode $E1^A$;

said layer made of N-doped or P-doped amorphous silicon;

said substrate made of crystalline silicon;

said layer made of P-doped or N-doped amorphous silicon;

an electronically conductive or semiconductor intermediate layer;

the sub-cell B comprising:

optionally a first electrode $E1^B$;

said lower layer;

said composite layer; and a second electrode $E2^B$.

* * * * *